United States Patent [19]

Mehlkopf et al.

[11] Patent Number: 5,481,192
[45] Date of Patent: Jan. 2, 1996

[54] MAGNETIC RESONANCE APPARATUS WITH NOISE CANCELLATION

[75] Inventors: Antoon F. Mehlkopf; Cornelis L. G. Ham, both of Eindhoven, Netherlands

[73] Assignee: U.S. Philips Corporation, New York, N.Y.

[21] Appl. No.: 150,655

[22] Filed: Nov. 10, 1993

[30] Foreign Application Priority Data

Nov. 10, 1992 [EP] European Pat. Off. .............. 92203435

[51] Int. Cl.$^6$ .................................................. G01V 3/00
[52] U.S. Cl. ........................................... 324/318; 324/322
[58] Field of Search ................................... 324/318, 322, 324/307, 309, 300, 314; 128/653.5

[56] References Cited

U.S. PATENT DOCUMENTS

| 4,677,677 | 6/1987 | Eriksson | 381/71 |
| 4,954,781 | 9/1990 | Hirata | 324/318 |

FOREIGN PATENT DOCUMENTS

| 1249042 | 10/1989 | Japan . |
| 1291848 | 11/1989 | Japan . |

OTHER PUBLICATIONS

"Reduction of Sound Levels with Antinoise in MR Imaging" Goldman et al, Radiology, vol. 173, No. 2, Nov. 1, 1989 pp. 549–550.

Primary Examiner—Louis M. Arana
Attorney, Agent, or Firm—Jack D. Slobod

[57] ABSTRACT

A magnetic resonance apparatus includes a magnet system (1) for generating a steady magnetic field in a measuring space (35), a gradient coil system (3) for generating gradient fields in the measuring space, and a power supply source (7) for the gradient coils (3) which comprises at least one gradient signal generator (9) and a number of gradient amplifiers (11), each of which is connected between an output of the gradient signal generator and at least one of the gradient coils. In order to cancel annoying noise caused by the gradient coils (3), the apparatus also includes a noise cancellation device which includes the following elements:

a) a first filter device (39) having a number of inputs which corresponds to the number of gradient amplifiers (11), each of the inputs being connected to an output of the gradient signal generator (9), and also includes a corresponding number of outputs, the first filter device having transfer functions, all of which correspond approximately to the transfer function of one of the chains extending from the gradient signal generator (9), via one of the gradient amplifiers (11), the gradient coil (coils) (3) connected to this gradient amplifier, and air, to a region (40, 42) which is referred to as a region of silence and in which the sound of the gradient coils (3) is to be cancelled; b) an adder circuit (51), having inputs which are connected to outputs of the first filter device (39) and an output (63) which is connected to an input of a sound reproducing device which comprises at least one sound reproducer (57) arranged in or near the region of silence (40); and c) a signal delay device (41) for inducing a predetermined time difference between the signal transfer from the gradient signal generator (9) to the gradient coils (3) on the one hand and the signal transfer from the gradient signal generator to the first filter device (39) on the other hand.

20 Claims, 3 Drawing Sheets

MAGNETIC RESONANCE APPARATUS WITH NOISE CANCELLATION

BACKGROUND OF THE INVENTION

1. Field of the Invention

The invention relates to a magnetic resonance apparatus, comprising a magnet system for generating a steady magnetic field in a measuring space, a gradient coil system for generating gradient fields in the measuring space, a power supply source for the gradient coils, which comprises at least a gradient signal generator and a number of gradient amplifiers, each of which is connected between an output of the gradient signal generator and at least one of the gradient coils, and also a noise cancellation device for generating a sound signal which is, in at least one region which is referred to as a region of silence, in phase opposition with a sound signal generated by the gradient coils in the region of silence.

2. Description of the Related Art

An apparatus of this kind is known, for example from the Abstract in English of JP-A-1-291 848. The gradient coils, situated within the magnetic field of the magnet system, act as loudspeaker coils when current flows therethrough, so that in the measuring space a sound is generated which may be very annoying to a patient being examined in the measuring space. The noise cancellation device serves to generate a sound signal which is in phase opposition with said sound so that the sound intensity in the measuring space is strongly reduced. In the known apparatus the sound caused by the gradient coils is detected, after which a sound signal of opposite phase is formed from the detected sound signal so as to be applied to a sound reproducer in the measuring space. This method is based on the assumption that the sound measured at a given instant T is substantially identical to the sound to be compensated at a later instant $T+\Delta T$. This has inter alia the following drawbacks:

1. some time elapses before the noise cancellation has reached its ultimate value;
2. when the gradient coils are driven in a non-periodic manner (for example, in the case of quickly changing preparatory gradients, a non-linear profile sequence, changing slice orientations), the noise cancellation device cannot follow the sound signals caused by the gradient coils, so that the noise cancellation is absent or very incomplete;
3. the switch-on and switch-off behaviour of the gradient coils is clearly audible, notably in the event of triggered exposures.

SUMMARY OF THE INVENTION

It is an object of the invention to provide a magnetic resonance apparatus of the kind set forth which enables said drawbacks to be completely or partly avoided. To achieve this, the apparatus in accordance with the invention is characterized in that the noise cancellation device comprises means for deriving said sound signal which is in phase opposition with the sound signal generated by the gradient coils at least partly from said gradient signal generator.

A preferred embodiment of the apparatus in accordance with the invention is characterized in that said gradient signal generator is adapted to generate a first signal to control said signal which is in phase opposition and a second signal to control said gradient fields, said first signal anticipating said second signal.

A further preferred embodiment is characterized in that the noise cancellation device comprises at least the following elements:

a) a first filter device which comprises a number of inputs which corresponds to the number of gradient amplifiers, each input being connected to an output of the gradient signal generator and also comprises a corresponding number of outputs, said first filter device having transfer functions, all of which correspond at least approximately to the transfer function of one of the chains extending from the gradient signal generator to the region of silence, via one of the gradient amplifiers, the gradient coil(s) connected to the relevant gradient amplifier, and air;

b) at least one adder circuit which comprises inputs which are connected to outputs of the first filter device and an output which is connected to an input of at least one sound reproduction device which comprises at least one sound reproducer arranged in or near the region of silence; and c) signal delay means which are operative to induce a predetermined time difference between the signal transfer from the gradient signal generator to the gradient coils on the one hand and the signal transfer from the gradient signal generator to the first filter device on the other hand.

The invention is based on the idea that the signals applied to the gradient coils are known in advance and can hence be used to generate the compensating sound signal before the disturbing sound signal is present. It can thus be ensured that the compensating sound signal is generated exactly simultaneously with the disturbing sound in the selected region. Moreover, the compensating sound signal is derived from the signal which will cause the disturbing sound somewhat later, so that the disturbing sound and the compensating sound can be substantially identical (evidently with a phase difference of 180°), irrespective of the nature of the signal applied to the gradient coils.

The first filter device serves as a model of the partly electric and partly acoustic connection between the gradient signal generator and the region of silence. A substantial part of the properties of this connection is determined by the construction of the apparatus. This part of these properties, therefore, is constant and can be measured in advance, so that the first filter device can be permanently adjusted. The further properties of said acoustic connection (notably of the part of the connection extending between the surface of the gradient coils and the region of silence) depend inter alia on the location and the acoustic properties of objects present in the measuring space or in the vicinity of the apparatus, for example a patient and the operators of the apparatus. Therefore, these properties change whenever another object is introduced into the measuring space and also when a patient present in the measuring space moves or when an operator moves. Therefore, it may be desirable to take this change into account for the determination of the transfer functions of the first filter device. Therefore, a preferred embodiment of the apparatus in accordance with the invention is characterized in that the transfer functions of the first filter device can be changed by means of correction signals which can be applied to a correction input of the first filter device, and that in or near the region of silence there is arranged a microphone which is connected to the correction input of the first filter device. Prior to the actual measurement, weak gradient signals can then be applied to the gradient coils which produce a weak (non-annoying) sound which is detected by the microphone. The detected signals are applied (after appropriate treatment) to the correction input of the first filter device, so that the transfer function of the filter device is adapted to the relevant circumstances. During the actual measurement the transfer function can still be continuously adapted to changing circumstances. Improved noise cancellation can thus be achieved.

A further embodiment of the apparatus in accordance with the invention is characterized in that the noise cancellation device comprises at least one second filter device which comprises a number of inputs corresponding to the number of gradient amplifiers, each input being connected to an output of the first filter device, and also comprises a corresponding number of outputs, each of which is connected to an input of the adder circuit, said second filter device having transfer functions which can be changed by way of correction signals which can be applied to a correction input of the second filter device, and that in or near the region of silence there is arranged a microphone which is connected to the correction input of the second filter device. An advantage of this embodiment consists in that the part of the transfer functions which is determined by the construction of the apparatus can be incorporated, if desired, in the first filter device; this need be done only once, so that this filter device can be adjusted, for example when the apparatus is installed. The part of the transfer functions which is dependent on the operating conditions generally is simpler than the former part. It can be incorporated in the second filter device and be modified in dependence on the circumstances. These modifications will usually be restricted to the introduction of frequency-dependent variations of signal delay times. During adjustment of the first filter device, the second filter device can be set to a "neutral" state in which the signal delay times have a predetermined value. These delay times can then be changed in the positive as well as the negative sense during operation of the device.

A further embodiment of the device in accordance with the invention is characterized in that at least one of the sound reproducing devices comprises a sound reproducer in the form of at least one loudspeaker. Using suitably arranged loudspeakers, noise cancellation can be achieved in a more or less extensive region. The loudspeakers may comprise plates of a piezoelectric material which are mounted against the surfaces of the gradient coils which face the measuring space. The sources of the annoying and of the compensating sound are then close to one another, which benefits the effectiveness of the noise cancellation.

In a further embodiment, the gradient coils are secured to a frame via mounting supports which are made of a piezoelectric material and which are provided with electrodes connected to the output of the adder circuit. Consequently, the gradient coils themselves act as loudspeaker diaphragms, so that the compensating sound is generated at the same location as the disturbing sound. This results in extremely effective noise cancellation.

A further embodiment is characterized in that at least one of the sound reproducing devices comprises sound reproducers in the form of two earphones which form part of a headset. The noise cancellation can thus be optimized for a person wearing the headset. To this end, the apparatus is preferably also characterized in that each sound reproducing device with sound reproducers in the form of earphones comprises, for each earphone, a third filter device which comprises an input which is connected to the output of the associated adder circuit and an output which is connected to the relevant earphone, said third filter device having a transfer function which can be changed by means of a correction signal to be applied to a correction input of the third filter device, which correction input is connected to a microphone permanently connected to relevant earphone.

In order to enable even better adaptation of the noise cancellation to the relevant person, a further embodiment is characterized in that exclusively sound reproducing devices comprising sound reproducers in the form of earphones are provided, each sound reproducing device being preceded by its own second filter device and its own adder circuit, the correction input of each second filter device being connected to at least one of the microphones connected to the relevant earphones.

In the latter embodiments the gradient signal generator is preferably also adapted to generate, if desired, signals of frequencies which are situated outside the range that is audible to humans, which signals serve as an aid for adjusting the transfer function of the third filter device. By continuously supplying the gradient coils with sound outside the audible frequency range, the sound compensation can still be readily adapted to changing circumstances during the measurement, for example changes in the peripheral conditions in the measuring space or changes in the posture of the person wearing the headphone.

BRIEF DESCRIPTION OF THE DRAWING

These and other aspects of the invention will be described in detail hereinafter with reference to the drawing, wherein.

DETAILED DESCRIPTION OF THE PREFERRED EMBODIMENT

Figure 1:
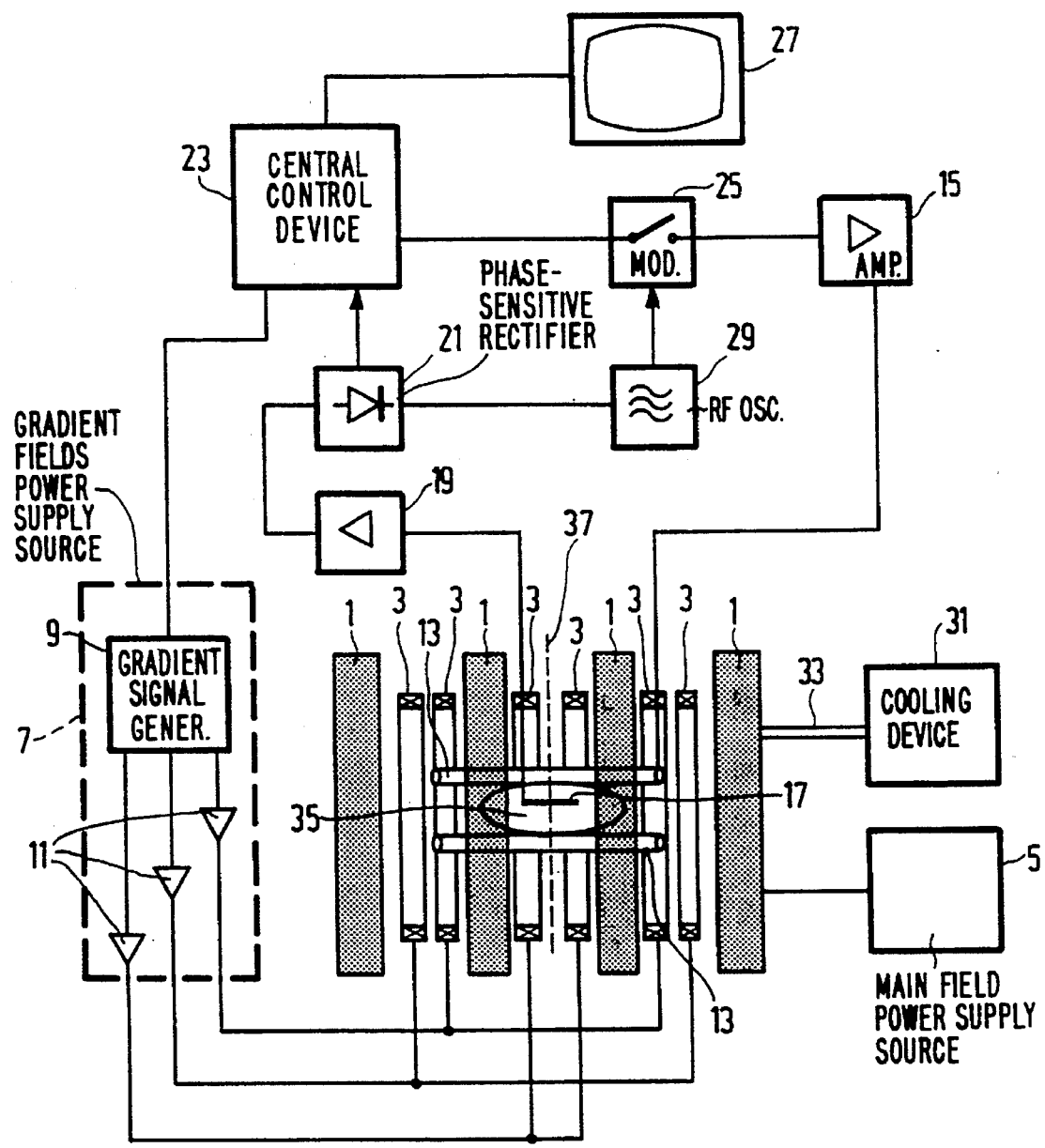
FIG. 1 shows diagrammatically an example of a magnetic resonance apparatus in which the invention can be used.

A magnetic resonance apparatus as shown in FIG. 1 comprises a magnet system 1 for generating a steady, uniform main magnetic field, a gradient coil system 3 for generating magnetic gradient fields, and power supply sources 5 and 7 for the magnet system 1 and the gradient coil system 3, respectively. The power supply source 7 for the gradient coil system 3 comprises a gradient signal generator 9 and a number of gradient amplifiers 11, i.e. three in the present embodiment. A magnet coil 13 serves to generate an RF magnetic alternating field and is connected to an RF source 15. For detection of magnetic resonance signals generated by the RF transmitted field in an object to be examined this Figure shows a surface coil 17. For read-out purposes the coil 17 is connected to a signal amplifier 19. The signal amplifier 19 is connected to a phase-sensitive rectifier 21 which is connected to a central control device 23. The central control device 23 also controls a modulator 25 that feeds the RF amplifier 15, the gradient signal generator 9 and a monitor 27 for display. An RF oscillator 29 controls the modulator 25 as well as the phase-sensitive rectifier 21 which processes the measuring signals. For cooling, if any, there is provided a cooling device 31 comprising cooling ducts 33. A cooling device of this kind may be constructed as a water cooling system for resistive coils or as a liquid helium or nitrogen dewar system for cooled superconducting coils. The transmitter coil 13, arranged within the magnet systems 1 and 3, generates an RF field in a measuring space 35 which, in the event of an apparatus for medical diagnostic measurements, is sufficiently large to accommodate patients. A steady magnetic field, gradient fields for position selection of slices to be imaged, and a spatially uniform RF alternating field can thus be generated in the measuring space 35.

The gradient coil system 3 is customarily symmetrical with respect to a radial symmetry plane 37, which hence also symmetrically divides the measuring space 35 in two and is directed through the point Z=0, transversely of the Z-axis (not shown) of the steady magnet system 1. The steady magnetic field generated by the stationary magnet system 1, therefore, is directed along the Z-axis. A gradient coil system 3 in a magnetic resonance apparatus customarily comprises a coil system for each of the coordinate directions X, Y and Z, activation of said coil systems enabling gradient fields to be generated in each of said directions so that a pixel-wise image of the object can be formed. The coil systems for the X-gradient and the Y-gradient are usually substantially identical, but rotated through 90° relative to one another from a azimuthal point of view. Each of the three coil systems for the X-, Y- and Z-gradients is connected, via one of the three gradient amplifiers 11, to a separate output of the gradient signal generator 9 which is operative to generate a suitable signal for each of the three coil systems. Because the gradient coils 3 are situated within the magnetic field generated by the magnet system 1, when current flows through these coils forces are generated which are capable of putting into motion the electric conductors constituting these coils and the supports on which they are mounted. The gradient coils thus act as loudspeaker coils and produce an annoying sound. Because the currents through the gradient coil are very large and the steady magnetic field is very strong, in given circumstances the sound level may become very high, for example more than 100 dBA. This sound is extremely annoying to the patient being examined by means of the apparatus as well as to the attending physician and other staff working in the direct vicinity of the apparatus.

Figure 2:
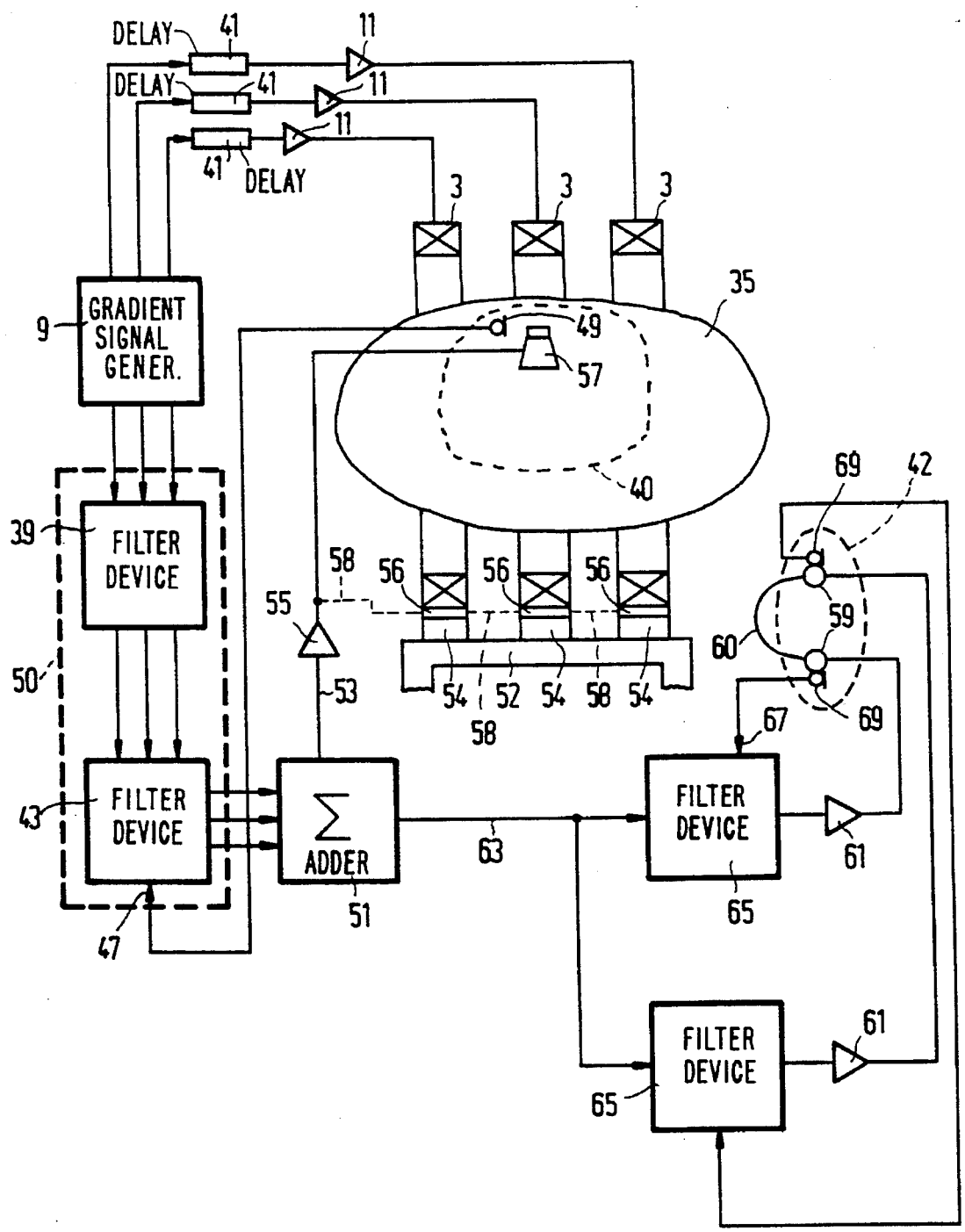
FIG. 2 shows a block diagram of a first embodiment of a part of the apparatus in accordance with the invention which is of importance for a suitable understanding of the invention.

FIG. 2 shows a block diagram of a first embodiment of a noise cancellation device which can be used in a magnetic resonance apparatus in order to achieve a substantial reduction, at least in a predetermined region, of the level of the sound produced by the gradient coils. The device shown in FIG. 2 serves to reduce the sound level in (a pan of) the measuring space 35, enclosed by the diagrammatically represented gradient coils 3, and in the direct vicinity of the apparatus. To this end there is provided a first filter device 39 which comprises a number of inputs which corresponds to the number of gradient amplifiers 11 (three in the present example), each input being connected to an output of the gradient signal generator 9. Each of these outputs of the gradient signal generator 9 supplies a signal which is identical to the signal supplied by one of the outputs connected to the gradient amplifiers 11. However, a predetermined time difference has been introduced between the signal transfer from the gradient signal generator 9 to the gradient coils 3 on the one hand and the signal transfer from the gradient signal generator to the first filter device 39 on the other hand. To this end there are provided signal delay means, for example in the form of a delay line inserted in the connection between each gradient amplifier 11 and the associated output of the gradient signal generator 9 (or in the connections between the gradient signal generator and the first filter device 39), the delay of said delay line being either permanently adjusted or adjustable, for example via the central control device 23. The delay means may also form pan of the central control device 23 which then controls the gradient signal generator 9 so that it outputs the signals via the outputs connected to the gradient amplifiers 11 later (or sooner) than the corresponding signals via the outputs connected to the first filter device 39. This embodiment is to be preferred, because in this case no delay lines are required.

The first filter device 39 comprises a number of outputs which corresponds to the number of inputs and the transfer function between each input and the associated output is chosen so that it corresponds at least approximately to the transfer function of the chain extending from the relevant output of the gradient signal generator 9, via one of the gradient amplifiers 11, the gradient coil (coils) 3 connected to the relevant gradient amplifier, and air, to a region which is to be referred to as a region of silence and which may be situated within the measuring space 35 (for example, a first region of silence 40) or outside the measuring space (for example, a second region of silence 42). Evidently, generally speaking said transfer function will not be the same for the two regions of silence, so that the relevant transfer function of the first filter device 39 usually can be an approximation only. The first filter device 39 may comprise filters, for example of the type described in U.S. Pat. No. 4,667,667.

A second filter device 43 comprises a number of inputs which again corresponds to the number of gradient amplifiers 11 and also comprises a corresponding number of outputs. Each input of the second filter device 43 is connected to one of the outputs of the first filter device 39. The second filter device 43 may also comprise filters of the type described in U.S. Pat. No. 4,667,667. The transfer functions of these filters can be varied by means of correction signals which can be applied to the second filter device 43 via a correction input 47. These correction signals may originate from a microphone 49 which is arranged in or near the first region of silence 40 and is connected (if desired, via signal processing means not shown) to the correction input 47. As a result of this facility, the transfer functions of the second filter device 43 can be adapted to changes in the transfer functions of said acoustic connections between the gradient coils 3 and the first region of silence 40. Preferably, this takes place during a preparatory phase preceding the actual measurement. During this preparatory phase, via each of the three gradient amplifiers 11 a signal of low level is successively applied to the gradient coil (coils) 3 connected thereto and the transfer function of the relevant part of the second filter device 43 is adapted to the relevant circumstances by means of the signal originating from the microphone 49. The transfer functions of the second filter device thus serve to correct the transfer functions of the first filter device 39. In the first region of silence substantially optimum compensation can thus be achieved for the sound produced by each of the gradient coils 3. It is alternatively possible to construct the first filter device 39 so that it has transfer functions which can be varied, thus forming a first filter device 50 which comprises a correction input 47 and which may be considered to be a combination of the first filter device 39 and the second filter device 43. This combined first filter device 50 is denoted by a dashed line in FIG. 2.

The outputs of the second filter device 43 are connected to corresponding inputs of an adder circuit 51 which is adapted to add the output signals of the second filter device and to form a noise cancellation signal from the signal resulting from this addition, which noise cancellation signal can be applied, via a first output 53 of the adder circuit, to a first sound reproducing device which comprises, for example an amplifier 55 and one or more loudspeakers 57. The noise cancellation signal formed by the adder circuit 51 is composed so that the sound reproduced by the loudspeaker (loudspeakers) 57 consist of components of substantially the same frequency and amplitude as the constituent components of the sound produced by the gradient coils 3 in the first region of silence 40, be it with a phase difference amounting to 180°. In the first region of silence 40 the two said sounds thus substantially cancel one another. The geometry and size of this region can be influenced by using a number of loudspeakers in a suitable configuration. A very good result can be obtained by mounting sheets of a piezoelectric material against the surfaces of the gradient coils 3, which sheets are connected to the amplifier 55 and act as loudspeakers. The disturbing sound and the compensating sound then originate substantially from the same source, so that very good noise compensation is achieved in the first region of silence 40. Said sheets of a piezoelectric material can be mounted on the surfaces of the gradient coils 3 which face the measuring space 35 as well as on their surfaces which are remote from the measuring space.

It is alternatively possible to mount the gradient coils 3 so that the gradient coils themselves act as loudspeaker diaphragms. To this end, the gradient coils 3 may be secured to a frame 52 via mounting supports 54 which are made of a piezoelectric material and which are provided with electrodes 56 which are connected, via connection leads (denoted by dashed lines), to the output of the amplifier 55.

In the described first sound reproducing device one or more loudspeakers 57 are used as sound reproducers. However, it is also possible to use other types of sound reproducers, for example two earphones 59 which form part of a headset 60, such as in a second sound reproducing device which also comprises two amplifiers 61, each of which is connected to a second output 63 of the adder circuit 51. The use of earphones offers the advantage that it enables noise cancellation individually adapted to the person wearing the earphones. To this end, preferably a third filter device 65 is connected between the second output 63 of the adder circuit 51 and each of the amplifiers 61. The third filter device 65 may also comprise a filter of the type described in U.S. Pat. No. 4,667,667 whose transfer function can be varied by means of a correction signal to be applied to a correction input 67 of the third filter device. This correction signal preferably originates from a microphone 69 which is connected to the correction input 67 (possibly via signal processing means not shown) and which is also permanently connected to the relevant earphone 59, for example because it is also built into the headset 60. The transfer function of the third filter device 65 can then be individually adjusted so that the sound produced at the area of the relevant earphone 59 by the gradient coils 3 is always compensated for by the sound produced by the second sound reproducing device, even when the person wearing the headset 60 moves. In order to enable fully automatic control of this sound compensation, the gradient signal generator 9 is preferably adapted so that it can generate, if desired (for example, under the control of the central control device 23) signals of frequencies situated outside the range audible to humans. The gradient coils 3 convert these signals into ultrasound which is intercepted by the microphone 69, resulting in a correction signal which can be applied to the correction input 67 of the third filter device 65 in order to adapt the transfer function thereof to the relevant circumstances.

The connections from and to the sound reproducers 57, 59 and the microphones 49, 69 can be formed, for example by electric conductors, by wireless connections or by optical connections via optical conductors. The sound reproducers and the microphones may also be situated outside the measuring space 35 and be acoustically connected to the relevant points within the measuring space via electrically insulating tubes.

Figure 3:
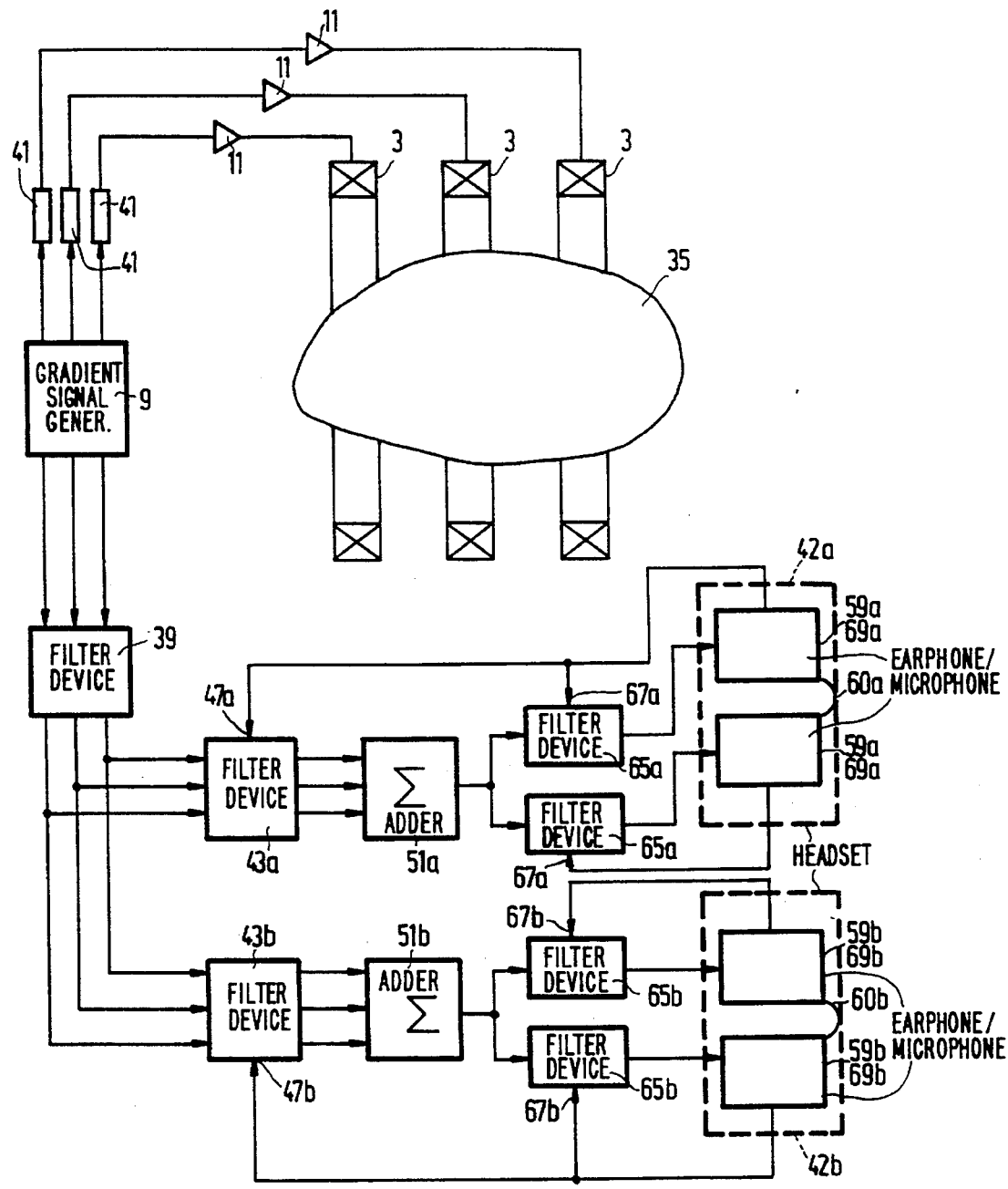
FIG. 3 shows a block diagram of a second embodiment.

FIG. 3 shows a second embodiment of the noise cancellation device for use in a magnetic resonance apparatus. Corresponding parts in FIG. 3 are denoted by the same reference numerals as used in FIG. 2. In the embodiment shown in FIG. 3 use is made exclusively of sound reproducing devices comprising sound reproducers in the form of earphones. Two of such sound reproducing devices are shown, the constituent parts thereof being denoted by the same reference numerals as used in FIG. 2, a letter a being added to one sound reproducing device and a letter b to the other sound reproducing device. In the embodiment shown in FIG. 3 each sound reproducing device is preceded by its own second filter device 43a, 43b and its own adder circuit 51a, 51b, respectively. The respective headsets 60a and 60b each comprise two combinations of an earphone 59a, 59b and a microphone 69a, 69b permanently connected thereto. For each of these combinations there is provided a third filter device 65a, 65b so that each sound reproducing device is formed by a headset with two earphone-microphone combinations and two third filter devices. Each of these sound reproducing devices is preceded by its own second filter device 43a, 43b and its own adder circuit 51a, 51b. Each of the correction inputs 47a, 47b of the second filter devices 43a, 43b is connected to one of the microphones 69a, 69b arranged near the associated earphones 59a, 59b, respectively. Each of these microphones is also connected, like in the first embodiment, to the correction input 67a, 67b of the third filter device 65a, 65b associated with the relevant earphone 59a, 59b. As a result, the transfer functions of the second filter devices 43a and 43b can also be individually adapted to the circumstances for each person wearing the relevant headset 60a, 60b. FIG. 3 shows two sound reproducing devices with earphones which are both situated outside the measuring space 35 and which are hence particularly suitable to compensate also for the noise annoying to physicians and other personnel in the direct vicinity of the magnetic resonance apparatus. The associated regions of silence, moving together with the persons wearing the headsets 60a, 60b, are denoted by the reference numerals 42a and 42b. Evidently, if desired, more of such sound reproducing devices can be used and, if desired, one of these devices can be arranged within the measuring space 35 so as to reduce the noise burden for a patient.

We claim:

1. A magnetic resonance apparatus, comprising a magnet system for generating a steady magnetic field in a measuring space, a gradient coil system for generating gradient fields in the measuring space, a power supply source for the gradient coils which comprises at least a gradient signal generator and a number of gradient amplifiers, each of which is connected between an output of the gradient signal generator and at least one of the gradient coils, and also a noise cancellation device for generating a compensating sound signal which is, in at least one region which is referred to as a region of silence, in phase opposition with a sound signal generated by the gradient coils in the region of silence, which noise cancellation device comprises means for deriving said compensating sound signal at least partly from said gradient signal generator.

2. A magnetic resonance apparatus as claimed in claim 1, wherein said gradient signal generator is adapted to generate a first signal to control said compensating sound signal and a second signal to control said gradient fields, said first signal anticipating said second signal.

3. A magnetic resonance apparatus as claimed in claim 1, wherein said cancellation device comprises at least the following elements:

a) a first filter device which comprises a number of inputs which corresponds to the number of gradient amplifiers, each input being connected to an output of the gradient signal generator, and also comprises a corresponding number of outputs, said first filter device having transfer functions, all of which correspond at least approximately to the transfer function of one of chains extending from the gradient signal generator to the region of silence, via one of the gradient amplifiers, the at least one of the gradient coils connected to the relevant gradient amplifier, and air;

b) at least one adder circuit which comprises inputs which are connected to outputs of the first filter device and an output which is connected to an input of at least one sound reproducing device which comprises at least one sound reproducer arranged in or near the region of silence; and c) signal delay means which are operative to induce a predetermined time difference between signal transfer from the gradient signal generator to the gradient coils on the one hand and signal transfer from the gradient signal generator to the first filter device on the other hand.

4. A magnetic resonance apparatus as claimed in claim 3, wherein the first filter device is configured such that it transfer functions can be changed by means of correction signals which can be applied to a correction input of the first filter device, and in or near the region of silence there is arranged a microphone which is connected to the correction input of the first filter device.

5. A magnetic resonance apparatus as claimed in claim 3, wherein the noise cancellation device comprises at least one second filter device which comprises a number of inputs which corresponds to the number of gradient amplifiers, each input being connected to an output of the first filter device, and also comprises a corresponding number of outputs, each of which is connected to an input of the adder circuit, said second filter device having transfer functions and being configured such that its transfer functions can be changed by means of correction signals which can be applied to a correction input of the second filter device, and in in or near the region of silence there is arranged a microphone which is connected to the correction input of the second filter device.

6. A magnetic resonance apparatus as claimed in claim 3, wherein at least one of the sound reproducing devices comprises a sound reproducer in the form of at least one loudspeaker.

7. A magnetic resonance apparatus as claimed in claim 6, wherein the loudspeakers comprise sheets of a piezoelectric material which are mounted on surfaces of the gradient coils which face the measuring space.

8. A magnetic resonance apparatus as claimed in claim 6, wherein the gradient coils are secured to a frame via mounting supports which are made of a piezoelectric material and which are provided with electrodes connected to the output of the adder circuit.

9. A magnetic resonance apparatus as claimed in claim 3, wherein at least one of the sound reproducing devices comprises sound reproducers in the form of two earphones which form part of a headset.

10. A magnetic resonance apparatus as claimed in claim 9, wherein each sound reproducing device with sound reproducers in the form of earphones comprises, for each earphone, a third filter device which comprises an input which is connected to the output of the associated adder circuit and an output which is connected to the relevant earphone, said third filter device having a transfer function which can be changed by means of a correction signal to be applied to a correction input of the third filter device, which correction input is connected to a microphone permanently connected to the relevant earphone.

11. A magnetic resonance apparatus as claimed in claim 9, wherein exclusively sound reproducing devices comprising sound reproducers in the form of earphones are provided, each sound reproducing device being preceded by its own second filter device and its own adder circuit, the correction input of each second filter device being connected to at least one of the microphones connected to the relevant earphones.

12. A magnetic resonance apparatus as claimed in claim 10, wherein the gradient signal generator is also configured to generate signals of frequencies which are situated outside the range that is audible to humans, which signals serve as an aid for adjusting the transfer function of the third filter device.

13. A magnetic resonance apparatus as claimed in claim 2, wherein said cancellation device comprises at least the following elements:

a) a first filter device which comprises a number of inputs which corresponds to the number of gradient amplifiers, each input being connected to an output of the gradient signal generator, and also comprises a corresponding number of outputs, said first filter device having transfer functions, all of which correspond at least approximately to the transfer function of one of chains extending from the gradient signal generator to the region of silence, via one of the gradient amplifiers, the at least one of the gradient coils connected to the relevant gradient amplifier, and air;

b) at least one adder circuit which comprises inputs which are connected to outputs of the first filter device and an output which is connected to an input of at least one sound reproducing device which comprises at least one sound reproducer arranged in or near the region of silence; and c) signal delay means which are operative to induce a predetermined time difference between signal transfer from the gradient signal generator to the gradient coils on the one hand and signal transfer from the gradient signal generator to the first filter device on the other hand.

14. A magnetic resonance apparatus as claimed in claim 13, wherein the first filter device is configured such that it transfer functions can be changed by means of correction signals which can be applied to a correction input of the first filter device, and in or near the region of silence there is arranged a microphone which is connected to the correction input of the first filter device.

15. A magnetic resonance apparatus as claimed in claim 13, wherein the noise cancellation device comprises at least one second filter device which comprises a number of inputs which corresponds to the number of gradient amplifiers, each input being connected to an output of the first filter device, and also comprises a corresponding number of outputs, each of which is connected to an input of the adder circuit, said second filter device having transfer functions and being configured such that its transfer functions can be changed by means of correction signals which can be applied to a correction input of the second filter device, and in in or near the region of silence there is arranged a microphone which is connected to the correction input of the second filter device.

16. A magnetic resonance apparatus as claimed in claim 4, wherein the noise cancellation device comprises at least one second filter device which comprises a number of inputs which corresponds to the number of gradient amplifiers, each input being connected to an output of the first filter device, and also comprises a corresponding number of outputs, each of which is connected to an input of the adder circuit, said second filter device having transfer functions and being configured such that its transfer functions can be changed by means of correction signals which can be applied to a correction input of the second filter device, and in in or near the region of silence there is arranged a microphone which is connected to the correction input of the second filter device.

17. A magnetic resonance apparatus as claimed in claim 14, wherein the noise cancellation device comprises at least one second filter device which comprises a number of inputs which corresponds to the number of gradient amplifiers, each input being connected to an output of the first filter device, and also comprises a corresponding number of outputs, each of which is connected to an input of the adder circuit, said second filter device having transfer functions and being configured such that its transfer functions can be changed by means of correction signals which can be applied to a correction input of the second filter device, and in in or near the region of silence there is arranged a microphone which is connected to the correction input of the second filter device.

18. A magnetic resonance apparatus as claimed in claim 13, wherein at least one of the sound reproducing devices comprises a sound reproducer in the form of at least one loudspeaker.

19. A magnetic resonance apparatus as claimed in claim 4, wherein at least one of the sound reproducing devices comprises a sound reproducer in the form of at least one loudspeaker.

20. A magnetic resonance apparatus as claimed in claim 14, wherein at least one of the sound reproducing devices comprises a sound reproducer in the form of at least one loudspeaker.

* * * * *